(12) United States Patent
Ikeno et al.

(10) Patent No.: US 8,410,529 B2
(45) Date of Patent: Apr. 2, 2013

(54) MAGNETIC RANDOM ACCESS MEMORY AND METHOD OF FABRICATING THE SAME

(75) Inventors: Daisuke Ikeno, Kanagawa-ken (JP); Koji Yamakawa, Tokyo (JP); Katsuaki Natori, Kanagawa-ken (JP); Yasuyuki Sonoda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 13/234,608

(22) Filed: Sep. 16, 2011

(65) Prior Publication Data

US 2012/0241879 A1 Sep. 27, 2012

(30) Foreign Application Priority Data

Mar. 24, 2011 (JP) ................ P2011-065284

(51) Int. Cl.
*H01L 29/66* (2006.01)

(52) U.S. Cl. . 257/252; 257/241; 257/421; 257/E29.323; 257/E21.665; 438/3

(58) Field of Classification Search .......... 257/241, 257/252, E29.323, E21.665; 438/3–14
See application file for complete search history.

(56) References Cited

U.S. PATENT DOCUMENTS

| | | | |
|---|---|---|---|
| 6,597,547 B1* | 7/2003 | Kawawake et al. | 360/324.11 |
| 8,081,404 B2* | 12/2011 | Ibusuki et al. | 360/324.12 |
| 8,143,684 B2* | 3/2012 | Nagamine et al. | 257/427 |
| 2001/0012186 A1* | 8/2001 | Sakakima et al. | 360/324.2 |
| 2001/0046110 A1* | 11/2001 | Kawawake et al. | 360/324.12 |
| 2002/0006529 A1* | 1/2002 | Sakakima et al. | 428/692 |
| 2004/0080876 A1* | 4/2004 | Sugita et al. | 360/324.2 |
| 2006/0209473 A1* | 9/2006 | Oshima et al. | 360/324.12 |
| 2007/0253118 A1* | 11/2007 | Hayakawa et al. | 360/324.2 |
| 2009/0110961 A1* | 4/2009 | Shibata et al. | 428/828 |
| 2009/0141410 A1* | 6/2009 | Jogo et al. | 360/324.2 |
| 2009/0161255 A1* | 6/2009 | Maeda | 360/110 |
| 2009/0161267 A1* | 6/2009 | Kawai et al. | 360/324.2 |
| 2010/0096716 A1* | 4/2010 | Ranjan et al. | 257/421 |
| 2010/0176472 A1* | 7/2010 | Shoji | 257/421 |
| 2010/0238237 A1 | 9/2010 | Seki | |
| 2011/0063899 A1* | 3/2011 | Ogimoto | 365/158 |
| 2011/0073970 A1* | 3/2011 | Kai et al. | 257/421 |
| 2011/0227018 A1* | 9/2011 | Kuribayashi et al. | 257/2 |

FOREIGN PATENT DOCUMENTS

JP 2010-214895 A 9/2010

OTHER PUBLICATIONS

U.S. Appl. No. 13/049,806, filed Apr. 16, 2011, Yamakawa et al.

* cited by examiner

*Primary Examiner* — N Drew Richards
*Assistant Examiner* — Ankush Singal
(74) *Attorney, Agent, or Firm* — Knobbe, Martens, Olson & Bear, LLP

(57) ABSTRACT

According to one embodiment, a semiconductor device, includes a magneto resistive element including a first magnetic layer, a first interface magnetic layer, a nonmagnetic layer, a second interface magnetic layer and a second magnetic layer as a stacked structure in order; and a metal layer including first metal atoms, second metal atoms and boron atoms, the metal layer being provided at least one region selected from under the first magnetic, between the first magnetic layer and the first interface magnetic layer, between the second interface magnetic layer and the second magnetic layer, and upper the second magnetic layer.

19 Claims, 5 Drawing Sheets

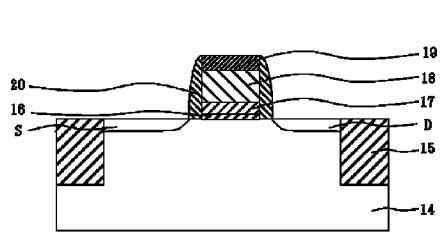
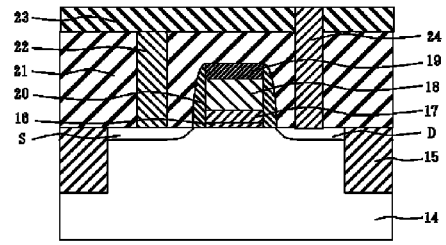
FIG.3A  FIG.3B
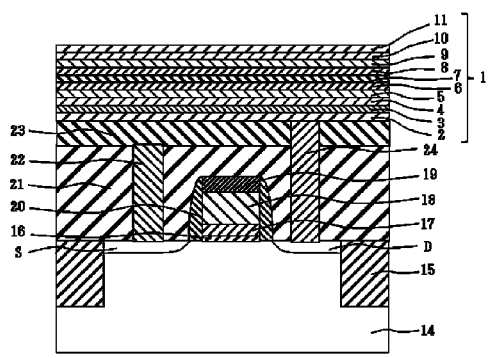
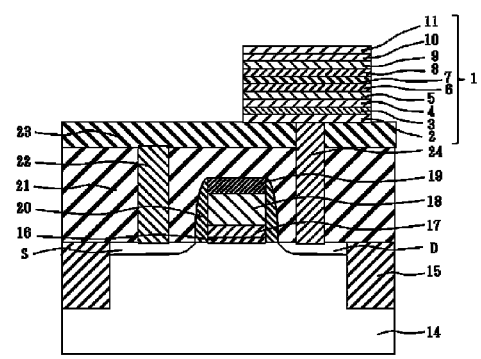
FIG.3C  FIG.3D
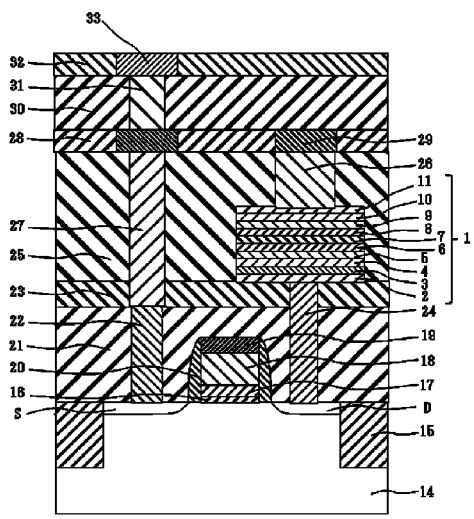
FIG.3E

MAGNETIC RANDOM ACCESS MEMORY AND METHOD OF FABRICATING THE SAME

CROSS REFERENCE TO RELATED APPLICATION

This application is based upon and claims the benefit of priority from prior Japanese Patent Application No. 2011-065284, filed on Mar. 24, 2011, the entire contents of which are incorporated herein by reference.

FIELD

Present embodiments relate to a magnetic random access memory and a method of fabricating the magnetic random access memory.

BACKGROUND

In recent years, magnetic random access memories (MRAMs) utilizing a tunneling magneto resistive (TMR) effect have been developed. Magneto resistive elements including magnetic tunnel junctions (MTJs) are used in the magnetic random access memories, and such magneto resistive elements have large magnetic resistance change ratios.

In spin injection writing currently under studying, a magneto resistive element structure utilizing perpendicular magnetization films is more preferable to utilizing in-plane magnetization films in terms of reduction in size and lowering electric current.

In a magneto resistive element using perpendicular magnetization films, a nonmagnetic layer that is used as a tunneling barrier film is sandwiched at both surfaces by amorphous interface magnetic layers. The amorphous interface magnetic layers are crystallized through heat treatment in order to achieve a large TMR ratio.

However, boron atoms contained in the interface magnetic layers may not be dissociated sufficiently in the heat treatment, making it difficult to sufficiently crystallize the interface magnetic layers.

BRIEF DESCRIPTION OF THE DRAWINGS

FIGS. 3A to 3E are cross-sectional views each showing a method of fabricating a magnetic random access memory according to the first embodiment;

DETAILED DESCRIPTION

According to one embodiment, a semiconductor device, includes a magneto resistive element including a first magnetic layer, a first interface magnetic layer, a nonmagnetic layer, a second interface magnetic layer and a second magnetic layer as a stacked structure in order; and a metal layer including first metal atoms, second metal atoms and boron atoms, the metal layer being provided at least one region selected from under the first magnetic, between the first magnetic layer and the first interface magnetic layer, between the second interface magnetic layer and the second magnetic layer, and upper the second magnetic layer.

Hereinbelow, embodiments will be described with reference to the drawings.

First Embodiment

A magnetic random access memory according to a first embodiment will be described below.

Figure 1:
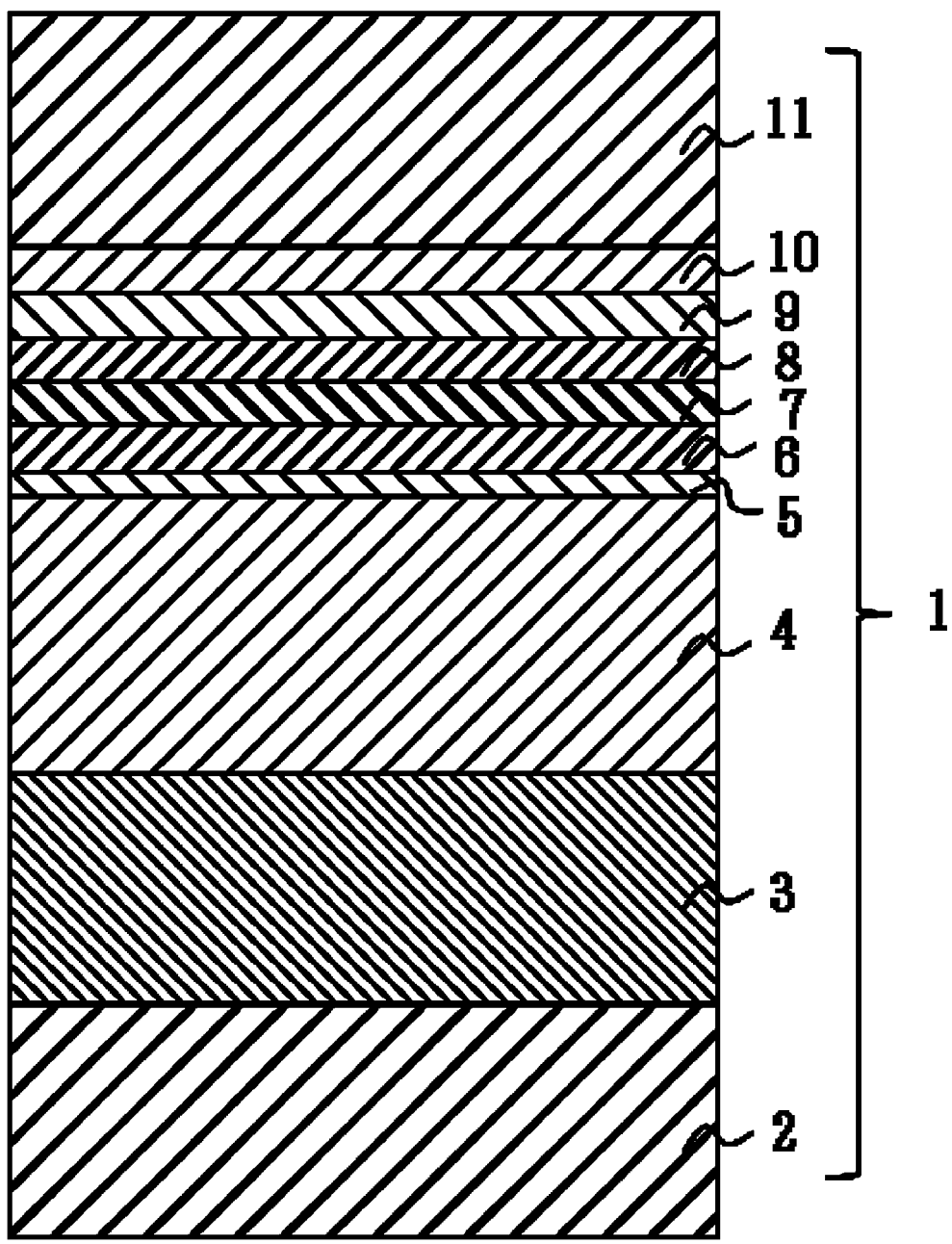
FIG. 1 is a cross-sectional view showing a basic structure of a magneto resistive element having a perpendicular magnetization according to first and second embodiments.

FIG. 1 is a cross-sectional view showing the basic structure of a magneto resistive element 1 having a perpendicular magnetization according to the first embodiment. As shown in FIG. 1, the magneto resistive element 1 according to the first embodiment includes a lower electrode 2, an orientation control film 3, a first magnetic layer 4, a lower metal layer 5, a first interface magnetic layer 6, a nonmagnetic layer 7, a second interface magnetic layer 8, an upper metal layer 9, a second magnetic layer 10, and an upper electrode 11.

As shown in FIG. 1, in the magneto resistive element 1 according to the first embodiment, the orientation control film 3 is provided on the lower electrode 2. Ta, Ir, Ru, Cu, or the like for example is used for the lower electrode 2. The orientation control film 3 is a film to control the crystalline orientation of the first magnetic layer 4 provided on the orientation control film 3. Pt, Ir, Ru, or the like for example is used for the orientation control film 3. A layered film of films made of atoms of the above materials may be used instead. The film thickness of the lower electrode 2 is approximately 50 Å for example. The film thickness of the orientation control film 3 is approximately 50 Å for example. Note that the orientation control film 3 may not be provided when the lower electrode 2 functions as an orientation control film.

The first magnetic layer 4 is provided on the orientation control film 3. The first magnetic layer 4 is a pinned layer for example. The pinned layer is a perpendicular magnetization film whose magnetization is oriented substantially perpendicular to the film surface, and the magnetization orientation is fixed to one direction. When the first magnetic layer 4 is the pinned layer, an alloy such as FePd, FePt, CoPt, CoPd, or CoFePt for example is used for the first magnetic layer 4. Besides the above alloys, it is also possible to use a Co/Pt artificial lattice obtained by alternately stacking Co films and Pt films or a Co/Pd artificial lattice obtained by alternately stacking Co films and Pd films. The film thickness of the first magnetic layer 4 is approximately 60 Å for example.

The lower metal layer 5 is provided on the first magnetic layer 4. The lower metal layer 5 is a layer to divide the crystalline orientations of the first magnetic layer 4 and the first interface magnetic layer 6. Ta for example is used for the lower metal layer 5. The film thickness of the lower metal layer 5 is approximately 5 Å for example.

The first interface magnetic layer 6 is provided on the lower metal layer 5. $Co_{50}Fe_{50}$ which is obtained by crystallizing amorphous $Co_{40}Fe_{40}B_{20}$ for example is used for the first interface magnetic layer 6. The amorphous $Co_{40}Fe_{40}B_{20}$ crystallizes and becomes $Co_{50}Fe_{50}$ as the boron concentration in amorphous $Co_{40}Fe_{40}B_{20}$ decreases through heat treatment or the like. The first interface magnetic layer 6 has a perpendicular magnetization due to exchange coupling with the first magnetic layer 4 which is a perpendicular magnetization film and with the like. The film thickness of the first interface magnetic layer 6 is approximately 10 Å for example.

The nonmagnetic layer 7 is provided on the first interface magnetic layer 6 as a tunnel insulator. The nonmagnetic layer 7 is of an oxide with a NaCl structure. An oxide with the NaCl structure whose (100) surface is small in the lattice mismatching with the first interface magnetic layer 6 should be selected as a desirable material. An insulator preferentially oriented in the [100] direction is obtained as the nonmagnetic layer 7 when a crystal growth takes place on an amorphous $Co_{40}Fe_{40}B_{20}$ alloy structure for example. MgO, CaO, SrO, TiO, VO, NbO, or the like for example is used for the nonmagnetic layer 7. Some other material may be used instead. The film thickness of the nonmagnetic layer 7 is approximately 10 Å for example.

The second interface magnetic layer 8 is provided on the nonmagnetic layer 7. The same material as the first interface magnetic layer 6 is used for the second interface magnetic layer 8. That is, $Co_{50}Fe_{50}$ obtained by crystallizing amorphous $Co_{40}Fe_{40}B_{20}$ for example is used. The second interface magnetic layer 8 has a perpendicular magnetization due to exchange coupling with the second magnetic layer 10 which is a perpendicular magnetization film and with the like. The film thickness of the second interface magnetic layer 8 is approximately 10 Å for example.

Figure 2:
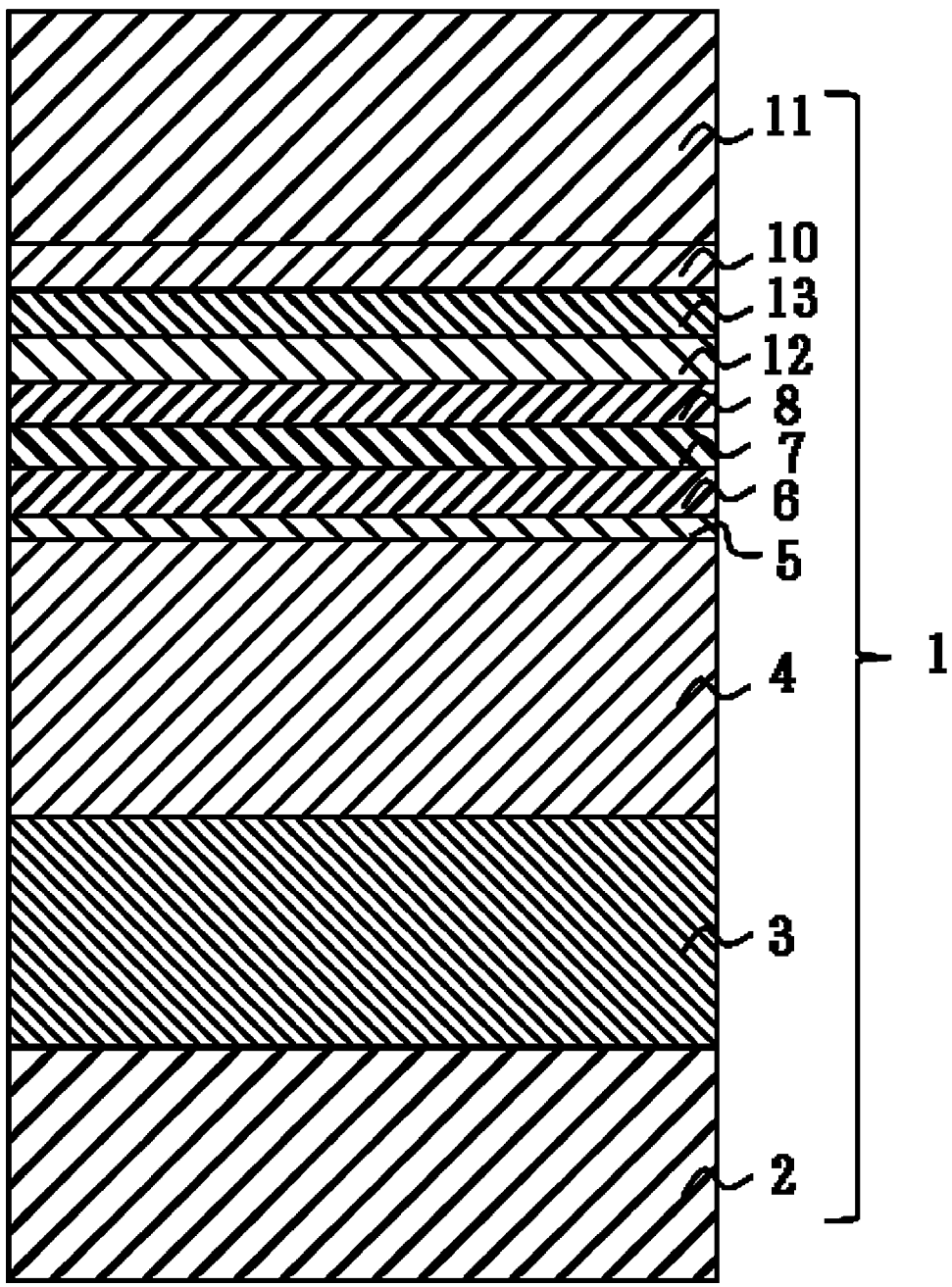
FIG. 2 is a cross-sectional view showing the basic structure of a magneto resistive element having a perpendicular magnetization according to the first embodiment.

The upper metal layer 9 containing first metal atoms, second metal atoms, and boron atoms is provided on the second interface magnetic layer 8. Ti, Zr, Hf, Nb, or La for example is used as the first metal atoms. Ta, W, Mo, Cr, or V for example is used as the second metal atoms. The film thickness of the upper metal layer 9 is approximately 8 Å for example. The upper metal layer 9 is obtained by alloying titanium atoms as the first metal atoms and tantalum atoms as the second metal atoms for example. As shown in FIG. 2, the upper metal layer 9 may be a film in which a first metal layer 12 being a titanium layer containing boron atoms and a second metal layer 13 being a tantalum layer containing boron atoms are stacked. The boron atoms contained in the upper metal layer 9 are diffused from the first interface magnetic layer 6 or the second interface magnetic layer 8 by heat treatment or the like and are bonded to the first metal atoms or the second metal atoms contained in the upper metal layer 9. The film thickness of the first metal layer 12 is approximately 3 Å for example. The film thickness of the second metal layer 13 is approximately 5 Å for example.

Containing the first metal atoms in the upper metal layer 9 can facilitate the dissociation of the boron atoms contained in the first interface magnetic layer 6 and the second interface magnetic layer 8 and thus facilitate the crystallization of the first interface magnetic layer 6 and the second interface magnetic layer 8. As a result, the crystalline orientations of the first interface magnetic layer 6 and the second interface magnetic layer 8 match each other, making it possible to achieve a high TMR ratio. Further, when the upper metal layer 9 contains the second metal atoms, atoms contained in the second magnetic layer 10 can be prevented from being diffused into the nonmagnetic layer 7 and the second interface magnetic layer 8 at the time of performing high-temperature heat treatment on the magneto resistive element 1, and a heat resistance property can be provided to the magneto resistive element 1. Since the upper metal layer 9 is provided in contact with the top of the second interface magnetic layer 8, the crystallization of the second interface magnetic layer 8 can be further facilitated.

The second magnetic layer 10 is provided on the upper metal layer 9. The second magnetic layer 10 is a free layer for example. The free layer is a perpendicular magnetization film whose magnetization is oriented substantially perpendicular to the film surface, and the magnetization orientation is variable. A Co/Pt artificial lattice obtained by alternately stacking Co films and Pt films or a Co/Pd artificial lattice obtained by alternately stacking Co films and Pd films is used for the free layer which is the perpendicular magnetization film. The film thickness of the second magnetic layer 10 is 10 Å for example.

The upper electrode 11 is provided on the second magnetic layer 10. Ta or Ru for example is used for the upper electrode 11. The film thickness of the upper electrode 11 is approximately 100 Å for example.

Next, a method of fabricating a magnetic random access memory according to the first embodiment will be described below by use of FIGS. 3A to 3E.

As shown in FIG. 3A, element isolation trenches are provided in a semiconductor substrate 14. An element isolation insulator 15, which is a silicon oxide film for example, is filled in each of the element isolation trenches to provide a STI (Shallow Trench Isolation) structure. A silicon oxide film is provided on the semiconductor substrate 14 as a gate insulator 16. An n-type poly crystalline silicon film is provided on the gate insulator as a gate electrode 17. A $Wsi_x$ film for example is provided on the gate electrode 17 as a word line 18. A SiN film for example is provided on the word line 18 as a nitride film 19. The nitride film 19, the word line 18, the gate electrode 17, and the gate insulator 16 are etched to provide a layered film as a selection transistor. A nitride film, which is a silicon nitride film for example, is provided on the semiconductor substrate 14 in such a manner as to cover the layered structure as the selection transistor. The nitride film is etched back to provide a spacer film 20. A source region S and a drain region D are provided in the semiconductor substrate 14 through ion implantation using the nitride film 19 and the spacer film 20 as masks, whereby the selection transistor is completed.

Next, as shown in FIG. 3B, a silicon oxide film for example is provided on the semiconductor substrate 14 as a first insulator 21 by plasma CVD (Chemical Vapor Deposition) in such a manner as to cover the selection transistor. Further, a contact hole is provided by lithography and RIE (Reactive Ion Etching) to expose the source region S.

As a metal barrier film (unillustrated), a Ti film and a TiN film are provided inside the contact hole by sputtering or CVD in a forming gas atmosphere. A contact plug material is provided on the metal barrier film. The contact plug material is a W film for example deposited by CVD. The contact plug material and the metal barrier film are planarized by CMP (Chemical Mechanical Polishing). As a result, a first contact plug 22 communicating with the source region S is provided in the first insulator 21.

A nitride film 23 is provided on the first insulator 21 and the first contact plug 22 by CVD. A contact hole communicating with the drain region D is provided. A metal barrier film (unillustrated) is provided inside the contact hole, and then a W film is provided on the metal barrier film as the material of a second contact plug 24. The W film is polished by CMP to provide the second contact plug 24. As a result, the second contact plug 24 communicating with the drain region D is provided in the first insulator 21.

Next, as shown in FIG. 3C, a magneto resistive element 1 is provided on and above the first contact plug 22, the second contact plug 24, and the first insulator 21 by processing steps shown below. A Ta layer with a film thickness of 50 Å is provided on and above the first contact plug 22, the second contact plug 24, and the first insulator 21 as a lower electrode 2.

A Pt film with a film thickness of 50 Å for example is provided on the lower electrode 2 as an orientation control film 3. A pinned layer is provided on the orientation control film 3 as a first magnetic layer 4. The pinned layer is a CoPt layer with a film thickness of 10 Å for example. A Ta layer with a film thickness of 5 Å for example is provided on the first magnetic layer 4 as a lower metal layer 5. An amorphous $Co_{40}Fe_{40}B_{20}$ layer with a film thickness of 10 Å for example is provided on the lower metal layer 5 as a first interface magnetic layer 6.

A tunnel insulator made of amorphous MgO and having a film thickness of 10 Å is provided on the first interface magnetic layer 6 as a nonmagnetic layer 7. An amorphous $Co_{40}Fe_{40}B_{20}$ layer with a film thickness of 10 Å for example is provided on the nonmagnetic layer 7 as a second interface magnetic layer 8.

An upper metal layer 9 containing the first metal atoms is provided on the second interface magnetic layer 8. The upper metal layer 9 is a Ti layer made of the first metal atoms for example. Note that the upper metal layer 9 may further contain the second metal atoms which are Ta atoms for example. In this case, in the upper metal layer 9, Ti atoms as the first metal atoms and Ta atoms as the second metal atoms for example are alloyed. As shown in FIG. 2, the upper metal layer 9 may be a film in which a Ti layer as a first metal layer 12 made of the first metal atoms and a Ta layer as a second metal layer 13 made of the second metal atoms are stacked sequentially. When the upper metal layer 9 contains the second metal atoms, atoms contained in the second magnetic layer 10 can be prevented from being diffused into the nonmagnetic layer 7 and the second interface magnetic layer 8 at the time of performing high-temperature heat treatment on a magneto resistive element 1, and a heat resistance property can be provided to the magneto resistive element 1.

Next, a free layer is provided on the upper metal layer 9 as a second magnetic layer 10. The free layer is a Co/Pt artificial lattice obtained by alternately stacking Co films and Pt films for example.

Next, a Ta layer with a film thickness of 100 Å is provided on the second magnetic layer 10 as an upper electrode 11.

By the above steps, the magneto resistive element 1 is provided. In the magneto resistive element 1, the first magnetic layer 4 is a pinned layer, and the second magnetic layer 10 is a free layer. Note, however, that the first magnetic layer 4 may be a free layer, and the second magnetic layer 10 may be a pinned layer instead.

In the above steps, the lower electrode 2, the orientation control film 3, the first magnetic layer 4, the lower metal layer 5, the first interface magnetic layer 6, the nonmagnetic layer 7, the second interface magnetic layer 8, the upper metal layer 9, the second magnetic layer 10, and the upper electrode 11 are each provided through sputtering for example.

Heat treatment is performed at 300 to 350° C. in vacuum for approximately 1 hour. As a result, MgO used as the nonmagnetic layer 7 is crystallized, and moreover amorphous $Co_{40}Fe_{40}B_{20}$ used as the first interface magnetic layer 6 and the second interface magnetic layer 8 are converted into crystalline $Co_{50}Fe_{50}$. The boron atoms dissociated from $Co_{40}Fe_{40}B_{20}$ bond to the first metal atoms contained in the upper metal layer 9. In the magneto resistive element 1 according to the first embodiment, the upper metal layer 9 containing the first metal atoms is provided on the second interface magnetic layer 8, and such a structure can facilitate the dissociation of the boron atoms contained in the first interface magnetic layer 6 and the second interface magnetic layer 8 and thus facilitate the crystallization of the first interface magnetic layer 6 and the second interface magnetic layer 8.

Note that when the heat treatment is performed, the second metal atoms contained in the lower metal layer 5 and the upper metal layer 9 may be allowed to bond to the boron atoms dissociated from the first interface magnetic layer 6 or the second interface magnetic layer 8.

Note that the heat treatment may be performed in a nitrogen atmosphere. Moreover, lamp heat treatment may be performed at 400° C. in vacuum for approximately 10 to 30 seconds through RTA (Rapid Thermal Annealing).

Next, as a hard mask (unillustrated), a silicon oxide film for example is provided by CVD. The upper electrode 11, the second magnetic layer 10, the upper metal layer 9, the second interface magnetic layer 8, the nonmagnetic layer 7, the first interface magnetic layer 6, the lower metal layer 5, the first magnetic layer 4, the orientation control film 3, and the lower electrode 2 are etched as shown in FIG. 3D by RIE. The second contact plug 24 and the magneto resistive element 1 retain to be connected each other.

As a protection film (unillustrated) of the magneto resistive element 1, a silicon nitride film is provided by CVD in such a manner as to cover the magneto resistive element 1.

Next, as shown in FIG. 3E, a silicon oxide film for example is provided on the nitride film 23 as a second insulator 25 in such a manner as to cover the protection film (unillustrated).

A third contact plug 26 connected to the upper electrode 11 of the magneto resistive element 1 and a fourth contact plug 27 connected to the second contact plug 24 are provided. The third contact plug 26 and the fourth contact plug 27 are provided by processing the second insulator 25 by lithography and RIE to provide a contact hole in the second insulator 25, filling Al in the contact hole, and then performing CMP.

An oxide film 28 is provided on the second insulator 25, the third contact plug 26, and the fourth contact plug 27. The oxide film 28 is processed by lithography and RIE in such a manner that the third contact plug 26 and the fourth contact plug 27 are exposed. As a result, trenches in which to provide first wirings 29 are provided. Al is filled in the trenches and then CMP is performed to provide the first wirings 29.

A third insulator 30 is provided on the oxide film 28 and the first wirings 29. Further, the third insulator 30 is processed by lithography and RIE in such a manner that one of the first wirings 29 is exposed. As a result, a via hole is provided. Thereafter, Al is filled in the via hole and CMP is performed to provide a via plug 31.

An oxide film 32 is provided on the third insulator 30 and the via plug 31. The oxide film 32 is processed by lithography and RIE in such a manner that the via plug 31 is exposed. As a result, a wiring trench in which to provide a second wiring 33 is provided. Further, Al is filled in the wiring trench and CMP is performed to provide the second wiring 33.

Note that a damascene process may be used to provide Cu wirings instead. In a case of using processing steps of a damascene process, Ta and TaN barrier films and a Cu seed layer are provided, and a filling process using Cu plating is performed to provide wirings. With the above fabrication steps, the magnetic random access memory according to the first embodiment is provided.

As described above, in the first embodiment, the upper metal layer 9 containing the first metal atoms is provided between the second interface magnetic layer 8 and the second magnetic layer 10. Such a structure can facilitate the dissociation of the boron atoms contained in the first interface magnetic layer 6 and the second interface magnetic layer 8 and thus facilitate the crystallization of the first interface magnetic layer 6 and the second interface magnetic layer 8. Further, when the upper metal layer 9 contains the second metal atoms, atoms contained in the second magnetic layer 10 can be prevented from being diffused into the nonmagnetic layer 7 and the second interface magnetic layer 8 at the time of performing high-temperature heat treatment on the magneto resistive element 1, and a heat resistance property can be provided to the magneto resistive element 1.

Second Embodiment

A magnetic random access memory according to a second embodiment will be described. In the configuration of the second embodiment, portions that are identical to those in the configuration of the magnetic random access memory of the first embodiment are denoted by the same reference signs, and detailed description thereof is omitted.

The second embodiment differs from the first embodiment in that the first metal atoms and the second metal atoms are contained in the lower metal layer 5 instead of being contained in the upper metal layer 9.

A method of fabricating a magnetic random access memory according to the second embodiment will be described.

In the first embodiment, the upper metal layer 9 containing the first metal atoms and the second metal atoms is provided on the second interface magnetic layer 8. On the other hand, in the second embodiment, a lower metal layer 5 containing the first metal atoms is provided on the first magnetic layer 4.

Like the first embodiment, as shown in FIGS. 3A and 3B, a selection transistor is provided on a semiconductor substrate 14, and then a first insulator 21, a first contact plug 22, and a second contact plug 24 are provided. A magneto resistive element 1 is provided on the second contact plug 24.

Next, like the first embodiment, as shown in FIG. 3C, the magneto resistive element 1 is provided by sequentially providing a lower electrode 2, an orientation control film 3, a first magnetic layer 4, an lower metal layer 5, a first interface magnetic layer 6, a nonmagnetic layer 7, a second interface magnetic layer 8, an upper metal layer 9, a second magnetic layer 10, and an upper electrode 11. In the above processing step, the lower metal layer 5 contains Ti atoms for example as the first metal atoms. The upper metal layer 9 includes a Ta layer for example. The lower metal layer 5 may further contain Ta atoms as the second metal atoms. When the lower metal layer 5 contains the second metal atoms, atoms contained in the first magnetic layer 4 can be prevented from being diffused into the first interface magnetic layer 6 and the nonmagnetic layer 7 when high-temperature heat treatment is performed on the magneto resistive element 1, and a heat resistance property can be provided to the magneto resistive element 1. Since the lower metal layer 5 is provided in contact with the bottom surface of the first interface magnetic layer 6, the crystallization of the first interface magnetic layer 6 can be further facilitated.

The upper metal layer 9 may not have to contain the first metal atoms. However, when the upper metal layer 9 includes a Ti film for example as the first metal atoms, the dissociation of the boron atoms contained in the first interface magnetic layer 6 and the second interface magnetic layer 8 can be facilitated, thus further facilitating the crystallization of the first interface magnetic layer 6 and the second interface magnetic layer 8.

Thereafter, the same processes as the first embodiment are performed, whereby the magnetic random access memory according to the second embodiment is provided.

As described above, in the second embodiment, the lower metal layer 5 containing the first metal atoms is provided between the first magnetic layer 4 and the first interface magnetic layer 6. Such a structure can facilitate the dissociation of the boron atoms contained in the first interface magnetic layer 6 and the second interface magnetic layer 8 and thus facilitate the crystallization of the first interface magnetic layer 6 and the second interface magnetic layer 8. Further, when the lower metal layer 5 contains the second metal atoms, atoms contained in the first magnetic layer 4 can be prevented from being diffused into the first interface magnetic layer 6 and the nonmagnetic layer 7 at the time of performing high-temperature heat treatment on the magneto resistive element 1, and a heat resistance property can be provided to the magneto resistive element 1.

When the lower metal layer 5 and the upper metal layer 9 contain the first metal atoms, the crystallization of the first interface magnetic layer 6 and the second interface magnetic layer 8 can be further facilitated.

Third Embodiment

Figure 4:
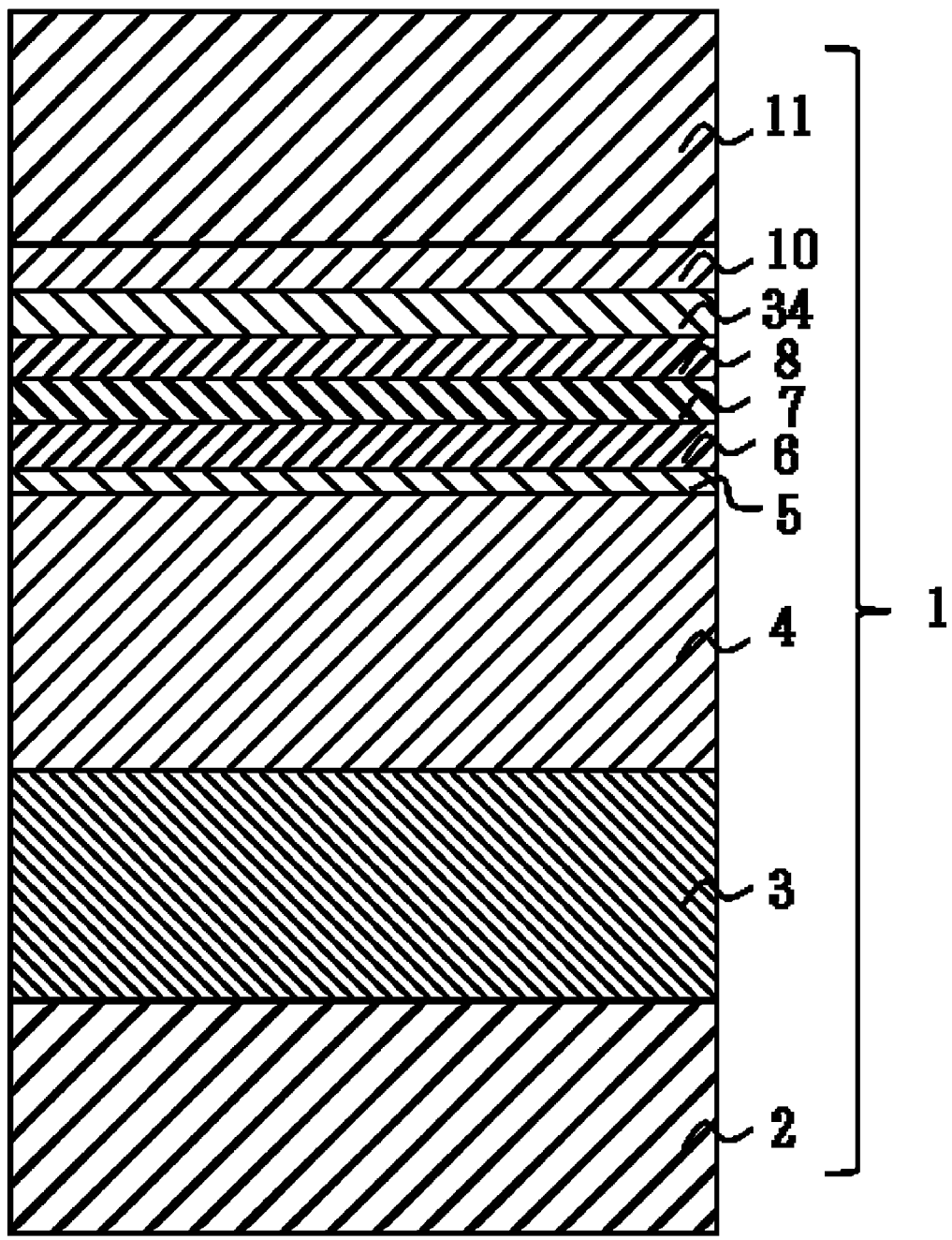
FIG. 4 is a cross-sectional view showing a basic structure of a magneto resistive element having a perpendicular magnetization according to a third embodiment.
Figure 5A:
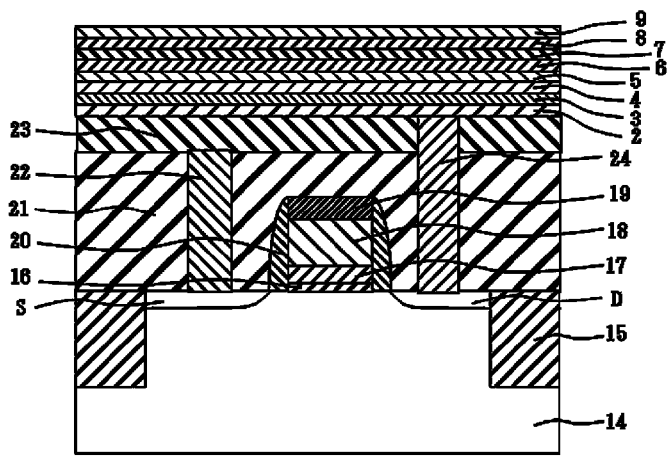
FIGS. 5A to 5C are cross-sectional views each showing a method of fabricating a magnetic random access memory according to the third embodiment.
Figure 5B:
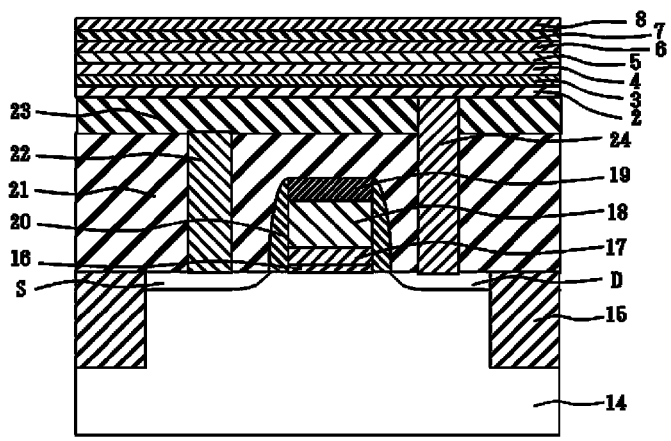
Figure 5C:
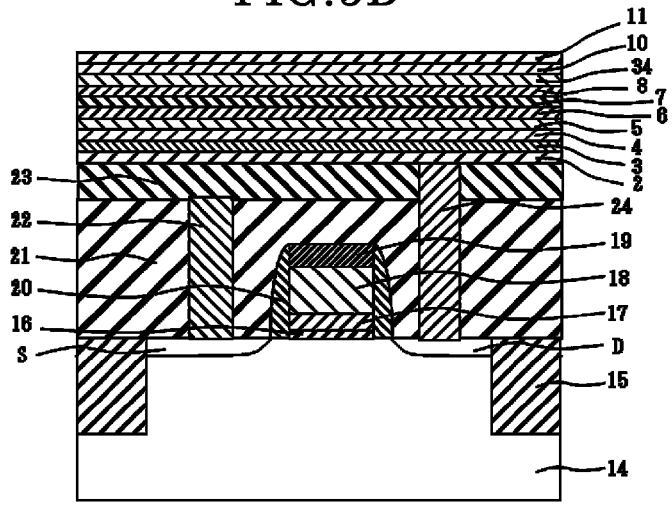

A method of fabricating a magnetic random access memory according to a third embodiment will be described by use of FIG. 4 and FIGS. 5A to 5C. FIG. 4 is a cross-sectional view showing the basic structure of a magneto resistive element having a perpendicular magnetization according to the third embodiment. FIGS. 5A to 5C are cross-sectional views each showing a method of fabricating a magnetic random access memory according to the third embodiment. In the configuration of the third embodiment, portions that are identical to those in the configuration of the magnetic random access memory of the first embodiment shown in FIG. 1 are denoted by the same reference signs, and detailed description thereof is omitted.

As shown in FIG. 1, the magneto resistive element 1 according to the first embodiment is provided with the upper metal layer 9 containing the first metal atoms, the second metal atoms, and boron atoms. On the other hand, as shown in FIG. 4, a magneto resistive element 1 according to the third embodiment is provided with a metal layer 34 instead of the upper metal layer 9 containing boron atoms.

Like the first embodiment, as shown in FIGS. 3A and 3B, a selection transistor is provided on a semiconductor substrate 14, and then a first insulator 21, a first contact plug 22, and a second contact plug 24 are provided.

As shown in FIG. 5A, a lower electrode 2, an orientation control film 3, a first magnetic layer 4, a lower metal layer 5, a first interface magnetic layer 6, a nonmagnetic layer 7, a second interface magnetic layer 8, and an upper metal layer 9 that contains Ti atoms for example as the first metal atoms are provided. Note that the upper metal layer 9 may further contain Ta atoms for example as the second metal atoms.

Heat treatment is performed at 300 to 350° C. in vacuum for approximately 1 hour. As a result, MgO used as the nonmagnetic layer 7 is crystallized, and moreover amorphous $Co_{40}Fe_{40}B_{20}$ used as the first interface magnetic layer 6 and the second interface magnetic layer 8 are converted into crystalline $Co_{50}Fe_{50}$. The boron atoms dissociated from $Co_{40}Fe_{40}B_{20}$ bond to the first metal atoms contained in the upper metal layer 9 which are Ti atoms for example.

As shown in FIG. 5B, reverse sputtering is performed on the upper metal layer 9 in vacuum to etch the upper metal layer 9. When the above method is used, the upper metal layer 9 does not need to contain the second metal atoms for the purpose of providing a heat resistance property to the magneto resistive element 1.

As shown in FIG. 5C, a Ta film made of the second metal atoms is provided as a metal layer 34. Like the first embodiment, a second magnetic layer 10 and an upper electrode 11 are provided on the metal layer 34.

Thereafter, the same processes as the first embodiment are performed, whereby the magnetic random access memory according to the third embodiment is provided.

As described above, in the third embodiment, heat treatment is performed such that the upper metal layer 9 can contain boron atoms. Thereafter, the upper metal layer 9 containing boron atoms are removed and the metal layer 34 made of the second metal atoms is provided. When the above method is used, the upper metal layer 9 does not need to contain the second metal atoms. That is, the first metal atoms contained in the upper metal layer 9 will not deteriorate the heat resistance property of the upper metal layer 9. Thus, the first interface magnetic layer 6 and the second interface magnetic layer 8 can be crystallized, and a heat resistance property can be secured as well.

A magnetic random access memory can be provided without re-diffusion of the boron atoms contained in the upper metal layer 9.

In the magnetic random access memories of the first to third embodiments described above, the lower metal layer 5 is provided between the first magnetic layer 4 and the second interface magnetic layer 8. However, the lower metal layer 5 may be provided below the first magnetic layer 4, specifically, between the lower electrode 2 and the orientation control film 3 or between the orientation control film 3 and the first magnetic layer 4 for example.

Moreover, the upper metal layer 9 is provided between the second interface magnetic layer 8 and the second magnetic layer 10, but may be provided on the second magnetic layer 10.

Furthermore, a free layer is used for the first magnetic layer 4 and a pinned layer is used for the second magnetic layer 10, but a pinned layer may be used for the first magnetic layer 4 and a free layer may be used for the second magnetic layer 10 instead.

Various modifications will become possible for those skilled in the art after receiving the teachings of the present disclosure without departing from the scope thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory, comprising:
   a magneto resistive element including a first magnetic layer, a first interface magnetic layer, a nonmagnetic layer, a second interface magnetic layer and a second magnetic layer as a stacked structure in order; and
   a metal layer including first metal atoms, second metal atoms and boron atoms, the metal layer being provided at least one region selected from under the first magnetic layer, between the first magnetic layer and the first interface magnetic layer, between the second interface magnetic layer and the second magnetic layer, and upper the second magnetic layer.

2. The magnetic random access memory of claim 1, wherein
   the metal layer is constituted with a first metal layer with both the first metal atoms and boron atoms and a second metal layer with both the second metal atoms and boron atoms.

3. The magnetic random access memory of claim 1, wherein
   the first metal atoms are composed of Ti, Zr, Hf, Nb or La.

4. The magnetic random access memory of claim 1, wherein
   the second metal atoms are composed of Ta, W, Mo, Cr or V.

5. The magnetic random access memory of claim 1, wherein
   a thickness of the metal layer is ranged from 5-8 Å.

6. The magnetic random access memory of claim 1, wherein
   the first interface magnetic layer is composed of crystallized $Co_{50}Fe_{50}$.

7. The magnetic random access memory of claim 1, wherein
   the second interface magnetic layer is composed of crystallized $Co_{50}Fe_{50}$.

8. The magnetic random access memory of claim 1, wherein
   the nonmagnetic layer is composed of an oxide material with a NaCl structure.

9. The magnetic random access memory of claim 8, wherein
   the nonmagnetic layer is composed of MgO, CaO, SrO, TiO, VO or NbO.

10. The magnetic random access memory of claim 1, further comprising:
    an orientation control film provided under the first magnetic layer.

11. A method of fabricating a magnetic random access, comprising:
    providing a first magnetic layer above a substrate;
    providing a first metal layer having at least one of first metal atoms and second metal atoms;
    providing a first interface magnetic layer containing boron atoms on the first metal layer;
    providing an nonmagnetic layer on the first interface magnetic layer;
    providing a second interface magnetic layer containing boron atoms on the nonmagnetic layer;
    providing a second metal layer containing at least the other of the first metal atoms and the second metal atoms;
    providing a second magnetic layer on the second metal layer; and
    performing a heat treatment with respect to the substrate.

12. The method of claim 11, wherein
    the second metal layer is constituted with a first metal layer with both the first metal atoms and boron atoms and a second metal layer with both the second metal atoms and boron atoms.

13. The method of claim 11, wherein
    the first metal atoms are composed of Ti, Zr, Hf, Nb or La.

14. The method of claim 11, wherein
    the second metal atoms are composed of Ta, W, Mo, Cr or V.

15. A method of fabricating a magnetic random access, comprising:
    providing a first magnetic layer above a substrate;
    providing a first interface magnetic layer having boron atoms above the first magnetic layer;
    providing an nonmagnetic layer on the first interface magnetic layer;
    providing a second interface magnetic layer having boron atoms on the nonmagnetic layer;
    providing a first metal layer having at least first metal atoms on the second interface magnetic layer;
    performing a heat treatment with respect to the substrate;
    removing the first metal layer; and providing a second magnetic layer above the second interface magnetic layer.

16. The method of claim 15, further comprising;
providing a second metal layer having second metal atoms on the second interface magnetic layer, after removing the first metal layer and before providing the second magnetic layer above the second interface magnetic layer.

17. The method of claim 15, further comprising;
providing a third metal layer containing at least the first metal atoms or the second metal atoms on the first magnetic layer, after providing the first magnetic layer above the substrate and before providing the first interface magnetic layer containing boron atoms on the first magnetic layer.

18. The method of claim 15, wherein
the first metal atoms are composed of Ti, Zr, Hf, Nb or La.

19. The method of claim 15, wherein
the second metal atoms are composed of Ta, W, Mo, Cr or V.

* * * * *